(12) United States Patent
Edwards et al.

(10) Patent No.: US 8,405,407 B2
(45) Date of Patent: Mar. 26, 2013

(54) CURRENT MEASUREMENT CIRCUIT AND MEASURING METHOD THEREOF INCLUDING A BINARY WEIGHTED CAPACITOR ARRAY

(75) Inventors: Martin John Edwards, Crawley (GB); Nicola Bramante, Swindon (GB)

(73) Assignee: Chimei Innolux Corporation, Chu-Nan (TW)

( * ) Notice: Subject to any disclaimer, the term of this patent is extended or adjusted under 35 U.S.C. 154(b) by 303 days.

(21) Appl. No.: 12/770,575

(22) Filed: Apr. 29, 2010

(65) Prior Publication Data
US 2010/0308845 A1   Dec. 9, 2010

Related U.S. Application Data

(60) Provisional application No. 61/217,904, filed on Jun. 5, 2009.

(51) Int. Cl.
*G01R 27/26* (2006.01)
(52) U.S. Cl. ........ 324/679; 324/678; 324/606; 324/676; 702/64
(58) Field of Classification Search .............. 324/678, 324/679, 606, 676; 702/64
See application file for complete search history.

(56) References Cited

U.S. PATENT DOCUMENTS

| | | | | |
|---|---|---|---|---|
| 3,923,397 A | * | 12/1975 | Shuck | 356/39 |
| 4,195,282 A | * | 3/1980 | Cameron | 341/172 |
| 4,295,089 A | * | 10/1981 | Cooperman | 323/351 |
| 4,691,189 A | * | 9/1987 | Dingwall et al. | 327/85 |
| 5,014,055 A | * | 5/1991 | Dingwall et al. | 341/159 |
| 5,103,230 A | * | 4/1992 | Kalthoff et al. | 341/166 |
| 5,140,326 A | * | 8/1992 | Bacrania et al. | 341/159 |
| 5,291,198 A | * | 3/1994 | Dingwall et al. | 341/159 |
| 5,367,302 A | * | 11/1994 | Kalthoff et al. | 341/166 |
| 5,726,654 A | * | 3/1998 | Hatae et al. | 341/161 |
| 6,498,438 B1 | * | 12/2002 | Edwards | 315/169.3 |
| 7,791,380 B2 | * | 9/2010 | Bramante et al. | 327/94 |
| 7,804,307 B1 | * | 9/2010 | Bokma et al. | 324/663 |
| 7,898,453 B2 | * | 3/2011 | Mathe | 341/172 |
| 7,952,343 B2 | * | 5/2011 | Edwards | 324/76.11 |
| 2001/0019274 A1 | * | 9/2001 | Goto | 324/678 |
| 2002/0084927 A1 | * | 7/2002 | Krymski et al. | 341/155 |
| 2008/0303507 A1 | | 12/2008 | Edwards | |
| 2009/0009376 A1 | * | 1/2009 | Chamming's | 341/172 |
| 2009/0167364 A1 | * | 7/2009 | Bramante et al. | 327/94 |

FOREIGN PATENT DOCUMENTS

WO   WO 2007069102 A2 *   6/2007

\* cited by examiner

*Primary Examiner* — Drew A Dunn
*Assistant Examiner* — Manuel Hernandez
(74) *Attorney, Agent, or Firm* — Liu & Liu

(57) ABSTRACT

A current measurement circuit for measuring a current is provided. The current measurement circuit includes a current integrating unit with a capacitor array, a comparator coupled to the current integrating unit, and a control unit coupled to the comparator and the current integrating unit. The current integrating unit integrates the current on the capacitor array to obtain an input voltage. The comparator compares the input voltage with a specific voltage to generate a compare output. The control unit generates a control signal to apply to the capacitor array of the current integrating unit according to the compare output. A magnitude of the current is obtained according to the control signal and the capacitance of the capacitor array.

11 Claims, 6 Drawing Sheets

US 8,405,407 B2

CURRENT MEASUREMENT CIRCUIT AND MEASURING METHOD THEREOF INCLUDING A BINARY WEIGHTED CAPACITOR ARRAY

CROSS REFERENCE TO RELATED APPLICATIONS

This application claims the benefit of U.S. Provisional Application No. 61/217,904, filed on Jun. 5, 2009, the entirety of which is incorporated by reference herein.

BACKGROUND OF THE INVENTION

1. Field of the Invention

The invention relates to a current measurement circuit, and more particularly, to a current measurement circuit which measures current over a wide dynamic range.

2. Description of the Related Art

Current measuring circuits are required in many devices. FIG. 1 shows a conventional current measurement circuit 100 disclosed in U.S. Publication 2008/0303507, which may be applied in thin film applications such as active matrix displays. The current measurement circuit 100 comprises a charge integrating circuit 2, a comparator circuit 4 and a logic circuit 6. The charge integrating circuit 2 integrates a charge from a current 10 to be measured and applies a change in voltage to a comparator circuit 4. The comparator circuit 4 compares the input voltage 12 with a threshold voltage level and provides an output 14 responsive thereto to the logic circuit 6. The logic circuit 6 generates a feedback signal 16 according to the comparator output 14 and provides the feedback signal 16 to the charge integrating circuit 2. Then, the charge integrating circuit 2 integrates a charge from the received feedback signal 16, which is opposite to the integrated charge from the current 10.

In FIG. 1, an integration time for integrating the current 10 is proportional to the current 10 being measured. For example, when a small current is being measured, the integration time is long and vice versa. A relatively long setup period is required, which is used to accurately set the input voltage 12 of the comparator 4 at a threshold value.

Furthermore, in FIG. 1, a feedback capacitor C is coupled to and between the input of the comparator circuit 4 and the output of the logic circuit 6. During a measurement period, the voltage applied to the feedback capacitor C by the logic circuit 6 is stepped, which will produce a step-up voltage at the input of the comparator circuit 4. Ideally, the voltage at the input of the comparator circuit 4 should be constant so that the current 10 to be measured is independent of the resistance of the current source 60 and transient currents which can occur in thin film devices due to sudden changes in a bias voltage may be prevented.

Therefore, a current measurement circuit for decreasing the duration of the initial integration period (setup period), reducing the difference in measurement time for large and small currents and reducing the step-up voltage at the input of the comparator circuit is desired.

BRIEF SUMMARY OF THE INVENTION

A current measurement circuit and a measuring method for measuring a current are provided. An exemplary embodiment of a current measurement circuit for measuring a current comprises a current integrating unit with a capacitor array, a comparator coupled to the current integrating unit, and a control unit coupled to the comparator and the current integrating unit. The current integrating unit integrates the current on the capacitor array to obtain an input voltage. The comparator compares the input voltage with a specific voltage to generate a compare output. The control unit generates a control signal which is applied to the capacitor array of the current integrating unit according to the compare output. A magnitude of the current is obtained according to the control signal and the capacitance of the capacitor array.

Furthermore, an exemplary embodiment of a measuring method for measuring a current is provided. The current is integrated on a capacitor array of a current integrating unit to obtain an input voltage. The input voltage is compared with a specific voltage to generate a compare output by a comparator. A control signal is generated to apply to the capacitor array of the current integrating unit according to the compare output by a control unit. A magnitude of the current is obtained according to the control signal and the capacitance of the capacitor array by the control unit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
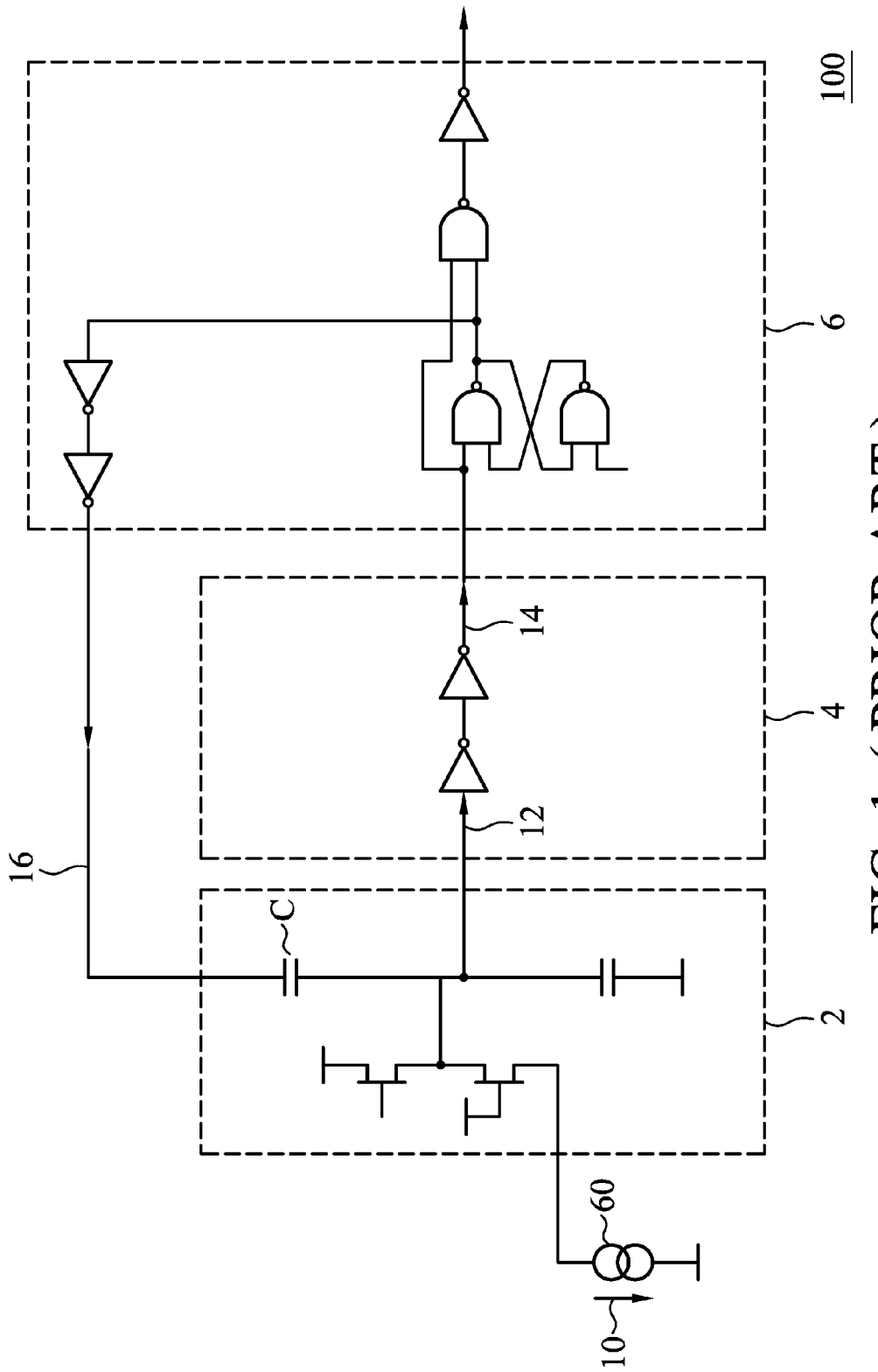
FIG. 1 shows a conventional current measurement circuit.
Figure 2:
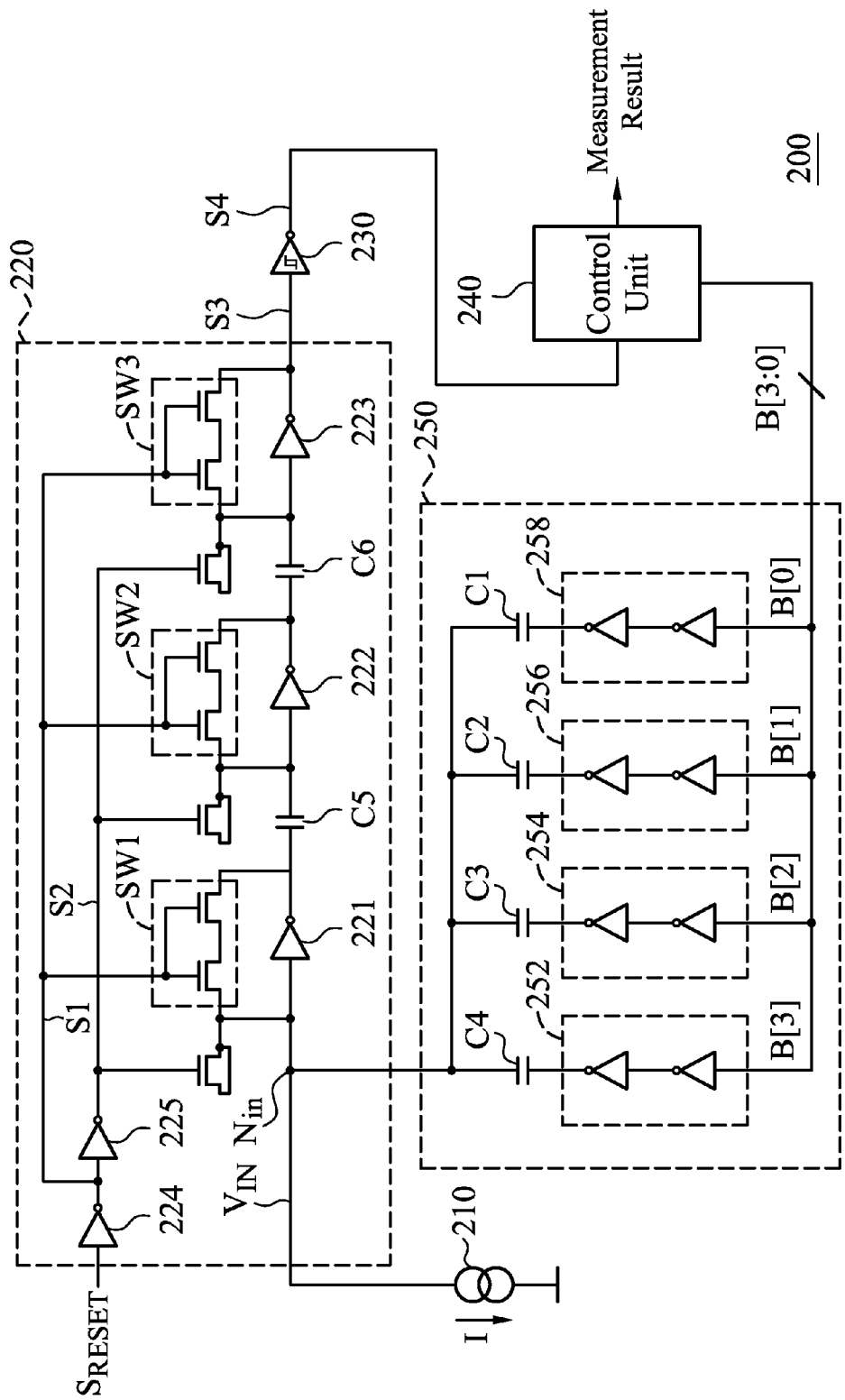
FIG. 2 shows a current measurement circuit for measuring a current according to an embodiment of the invention.

FIG. 2 shows a current measurement circuit 200 for measuring a current I according to an embodiment of the invention. The current I to be measured is provided by a current source 210. In the embodiment, the current source 210 is a photo diode. The current measurement circuit 200 comprises a comparator 220, a Schmitt inverter 230 with hysteresis, a control unit 240 and a current integrating unit 250. The comparator 220 comprises three series connected inverters 221, 222 and 223, a capacitor C5 coupled between the inverters 221 and 222, and a capacitor C6 coupled between the inverts 222 and 223. Furthermore, the comparator 220 further comprises three offset correction switches SW1, SW2 and SW3, each connected with the corresponding inverter in parallel. For example, the switch SW1 is connected with the inverter 221 in parallel, which comprises two transistors connected in series. In one embodiment, the comparator 220 only comprises a single inverter having an offset correction switch in order to reduce size for the current measurement circuit 200.

In addition, the comparator 220 further comprises two inverters 224 and 225 connected in series. The inverter 224 generates a signal 51 to switch the switches SW1, SW2 and SW3 according to a reset signal $S_{RESET}$, and the inverter 225 generates a signal S2 according to the signal 51. When the switches SW1, SW2 and SW3 are turned off by the signal 51 at the end of a reset state, charge may be injected into each input terminal of the inverters 221, 222 and 223. In the meantime, the transistors controlled by the signal S2 are used to provide compensation for the charge injection. The Schmitt inverter 230 is coupled to and between the comparator 220 and the control unit 240 and generates a signal S4 to the control unit 240 according to an output signal S3 of the comparator 220. In the current measurement circuit 200, the Schmitt inverter 230 is used to prevent occurrence of an undefined signal S4 state during a reset state. The current integrating unit 250 comprises a capacitor array comprising a plurality of capacitors C1, C2, C3 and C4, each having one terminal coupled to an input node $N_{in}$ of the comparator 220 and another terminal driven by a control signal B[3:0] derived from the control unit 240. The control signal B[3:0] is a multi-bit binary signal which is composed of four bit signals B[3], B[2], B[1] and B[0], wherein the bit signal B[0] is a Least Significant Bit (LSB) and the bit signal B[3] is a Most Significant Bit (MSB). In addition, the current integrating unit 250 further comprises four buffers 252, 254, 256 and 258, wherein each buffer formed by two inverters connected in series is coupled to the corresponding capacitor and is used to buffer the bit signal before the bit signal is applied to the corresponding capacitor. In the embodiment, capacitances of the capacitors C1, C2, C3 and C4 are binary weighted, such as C1:C2:C3:C4=1:2:4:8.

Figure 3:
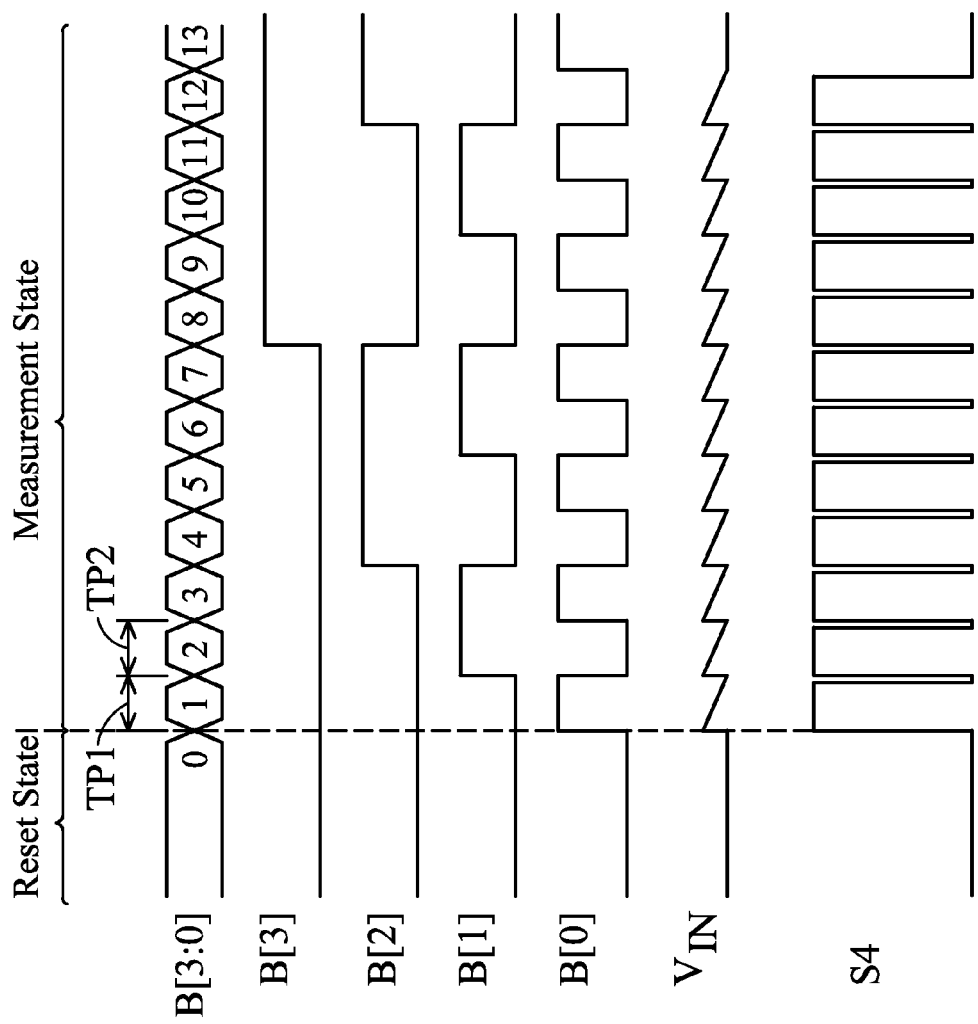
FIG. 3 shows an example of waveforms illustrating the signals of the current measurement circuit in FIG. 2.

FIG. 3 shows an example of waveforms illustrating the signals of the current measurement circuit 200 in FIG. 2. In FIG. 3, the value of the control signal B[3:0] is represented by a decimal format. A signal $V_{IN}$ represents a voltage of the input node $N_{in}$ for the comparator 220. At the start of the measurement process, the current measurement circuit 200 is reset by setting the signal $S_{RESET}$ to low during a reset state. During the reset state, the switches SW1, SW2 and SW3 which are separately connected between the input and output terminals of the inverters 221, 222 and 223 in the comparator 220 are turned on. Thus, the input and output voltages of the inverters 221, 222 and 223 may become equal to the threshold voltages of the inverters 221, 222 and 223, respectively. In the embodiment, the threshold voltages of the inverters 221, 222 and 223 are equal in order to simplify description. Also, the voltage of the signal $V_{IN}$ is set equal to the threshold voltage of the inverter 221 of the comparator 220 during the reset state. Furthermore, the control signal B[3:0] applied to the capacitors C1, C2, C3 and C4 are set to a initial value during the reset state. The initial value is chosen according to the polarity of the current I. In FIG. 3, it is assumed that a negative current is being measured which means that the capacitors C1, C2, C3 and C4 must supply a positive charge flow at the input node $N_{in}$ and therefore the control signal B[3:0] initially has a low voltage.

When the signal $S_{RESET}$ rises to a high level, the current measurement circuit 200 enters a measurement state to integrate the current I on an equivalent capacitance at the input node $N_{in}$, wherein the equivalent capacitance is obtained according to the capacitances of the capacitors C1, C2, C3 and C4. Thus, the voltage of the signal $V_{IN}$ starts to fall and the signal S4 of the Schmitt inverter 230 switches to a low level when the signal $V_{IN}$ falls below the threshold voltage of the comparator 220. Next, the low state of the signal S4 is detected by the control unit 240 which in response changes/increases the control signal B[3:0] causing a positive voltage step-up at the input node $N_{in}$ which raises the voltage at the input of the comparator 220 above the threshold voltage and causes the signal S4 to return to a high level. After increasing the control signal B[3:0], the current I continues to be integrated at the input node $N_{in}$ and the voltage of the signal $V_{IN}$ therefore falls. If the voltage of the signal $V_{IN}$ again falls below the threshold voltage of the comparator 220, the signal S4 would eventually become low again and then the control unit 240 would increase the control signal B[3:0] by one LSB. As shown in FIG. 3, the control unit 240 increases the control signal B[3:0] by one LSB at the start of every integration period. For example, the control unit 240 sets the control signal B[3:0] to "1" at the start of an integration period TP1, and then the control unit 240 sets the control signal B[3:0] to "2" at the start of an integration period TP2. During the measurement state, the process of detecting the switching of the signal S4 and stepping-up of the voltage of the level of the signal $V_{IN}$ applied to the capacitors C1, C2, C3 and C4 is continued until either the measurement state is completed, i.e. a certain measurement time is reached, or the maximum code of the control signal B[3:0] is reached. This process of changing the voltages applied to the capacitors C1, C2, C3 and C4 in order to compensate for the charge being integrated at the input node $N_{in}$ is repeated throughout the measurement state. At the end of the measurement state, a measurement result indicates the magnitude of the current I which can be generated by the control unit 240 according to the changes in the level of the voltage applied to the capacitors C1, C2, C3 and C4 and the time periods at which the signal S4 is switched. In FIG. 3, the value of control signal B[3:0] and time intervals of the integration periods TP1 and TP2 are used as an example for description, and does not limit the invention.

Figure 4:
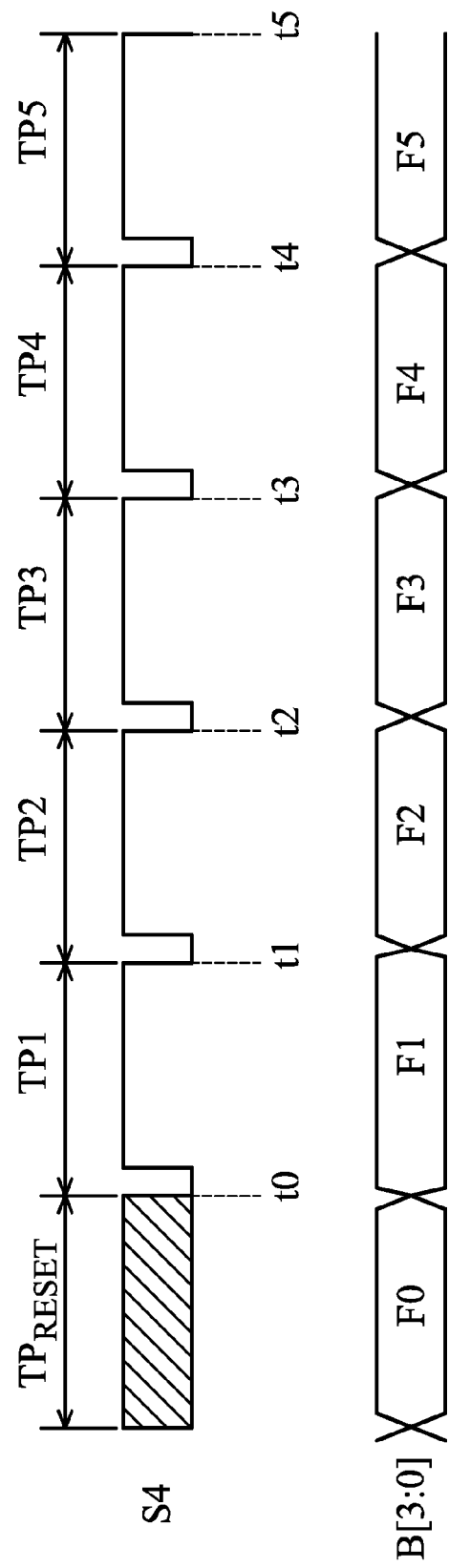
FIG. 4 shows another example of waveforms illustrating the switching of the signal received by the control unit and the codes of the control signal applied to the capacitors of FIG. 2.

Specifically, a magnitude of the current I can be calculated by the control unit 240 according to the code of the control signal B[3:0], the capacitances of the capacitors C1, C2, C3 and C4 and the time periods at which the signal S4 switches. FIG. 4 shows another example of waveforms illustrating the switching of the signal S4 and the codes of the control signal B[3:0] applied to the capacitors C1, C2, C3 and C4 of FIG. 2. Referring to FIG. 2 and FIG. 4 together, first, the code of the control signal B[3:0] is set to F0 and the switches SW1, SW2 and SW3 are turned on during a reset period $TP_{RESET}$. Thus, the voltage of the signal $V_{IN}$ is set close to the threshold voltage of the comparator 220. Next, at the start of an integration period TP1, the code of the control signal B[3:0] is changed to a new value F1. The chosen value of F1 must ensure that following the reset period $TP_{RESET}$ the signal S4 initially rises to a high level. When the voltage of the signal $V_{IN}$ has a value equal to the threshold voltage of the comparator 220 due to a high to low transition of the signal $V_{IN}$, the signal S4 switches to a low level. The integration of the current I between the switching processes, for example between times t1 and t2, must therefore be equal to the charge injected onto or removed from the input node $N_{in}$ by changing the control signal B[3:0].

If the smallest capacitor in the binary weighted capacitor array formed by the capacitors C1, C2, C3 and C4 has a value C, the amount of charge injected onto the input node $N_{in}$ will be (F2−F1)×C×V when the code of the control signal B[3:0] is changed from F1 to F2, where V represents the magnitude of the logic voltage of the control signal B[3:0] and (F2−F1)×C represents the effective capacitance to which the change in voltage was applied. Therefore, the average current I integrated during the integration periods from t1 to t5 can be calculated as $$I=(F5-F1)\times C\times V/(t5-t1).$$

It is to be noted that, the integration period TP1 is not used in the calculation of the current I for the following reason. When the signal S4 switches to a low level at time t1, t2, t3 and so on, the voltage of the signal $V_{IN}$ has a particular value equal to the threshold voltage of the comparator 220. At time t0, the voltage of the signal $V_{IN}$ is below the threshold voltage of the comparator 220 but the actual value of the signal $V_{IN}$ is not known. Therefore, using the integration period TP1 to calculate the current I may introduce errors into the calculated result. Specifically, the integration period TP1 represents a setup period of the current measurement circuit 200.

Figure 5:
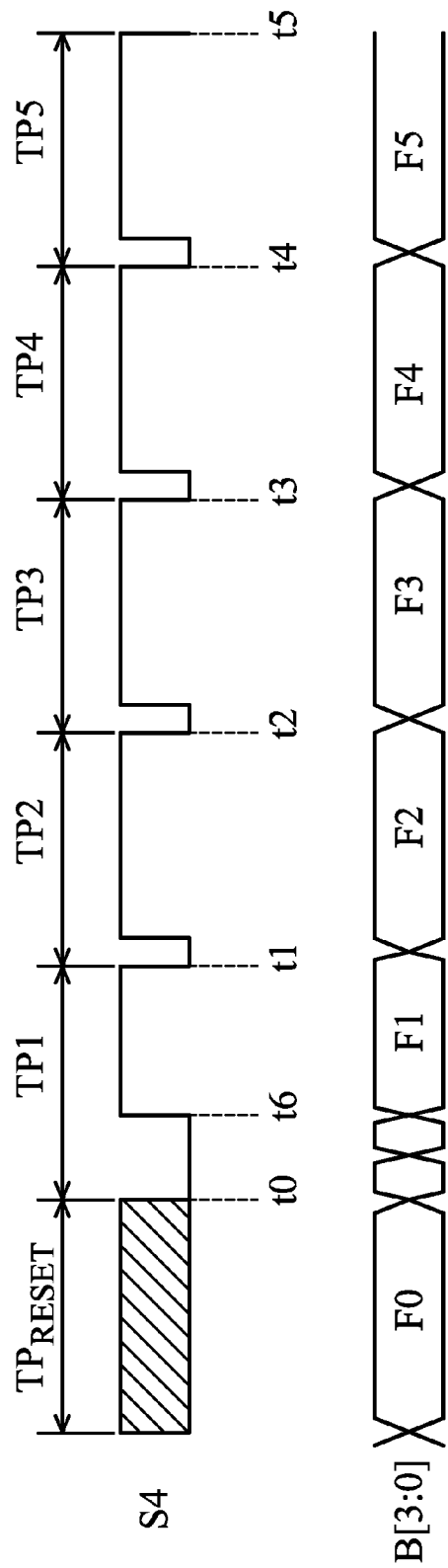
FIG. 5 shows another example of waveforms illustrating the switching of the signal received by the control unit and the codes of the control signal of FIG. 2.

The threshold voltage of the comparator 220 in FIG. 2 depends on charge injection effects which occur at the end of the reset period $TP_{RESET}$, which is not easily predicted. Thus, it may be necessary to determine the value of F1 by a process in which the code of the control signal B[3:0] is stepped-up until the signal S4 switches to a high level, as shown in FIG. 5. FIG. 5 shows another example of waveforms illustrating the switching of the signal S4 and the codes of the control signal B[3:0] of FIG. 2. Referring to FIG. 2 and FIG. 5 together, the signal S4 is in a low state at the end of the reset period $TP_{RESET}$. The code of the control signal B[3:0] is increased and then the signal S4 is monitored by the control unit 240. The measurement begins when the signal S4 is at a high level, but if the signal S4 is still at a low level then the code of the control signal B[3:0] is increased once again. This process of increasing the code of the control signal B[3:0] and monitoring the signal S4 is repeated until the signal S4 rises to a high level (e.g. at time t6). The integration period TP1 represents the setup period for the current measurement circuit 200.

Figure 6:
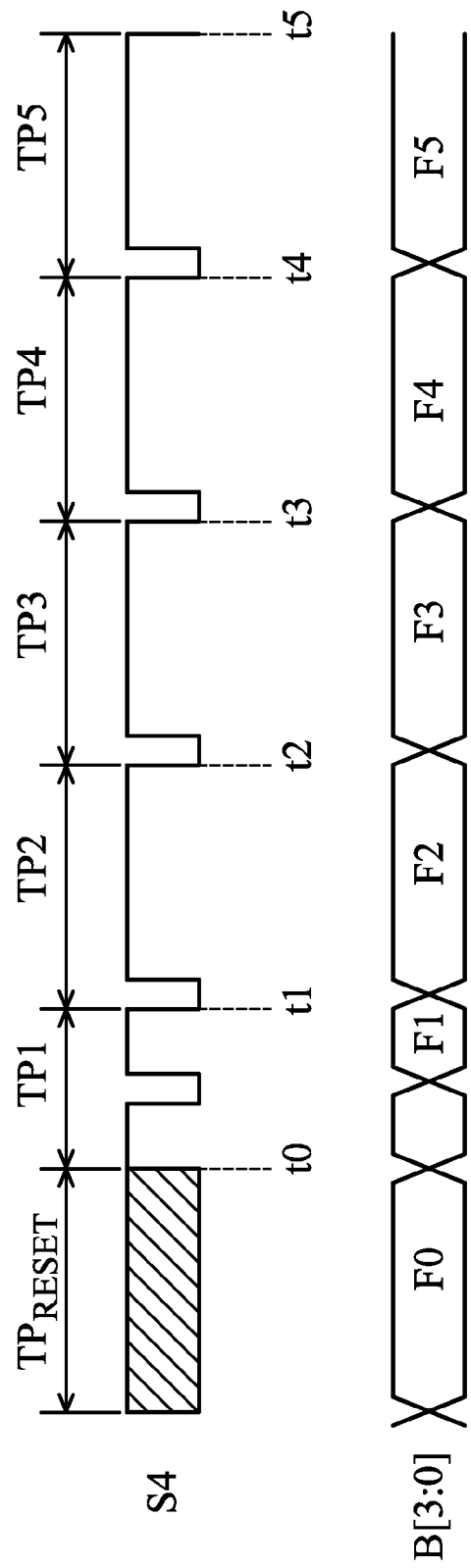
FIG. 6 shows another example of waveforms illustrating the switching of the signal received by the control unit and the codes of the control signal of FIG. 2.

FIG. 6 shows another example of waveforms illustrating the switching of the signal S4 and the codes of the control signal B[3:0] of FIG. 2. The signal S4 rises to a high level at the end of the reset period $TP_{RESET}$ even without the code of the control signal B[3:0] being changed. Therefore, the code of the control signal B[3:0] is first decreased until the signal S4 switches to a low level, and then the code of the control signal B[3:0] is increased so as to set the signal S4 to a high level.

Referring to FIG. 2, the first code of the control signal B[3:0] following reset (i.e. F1 of FIGS. 3-6) may be periodically determined rather than during each measurement. In addition, a time delay from switching the code of the control signal B[3:0] to the signal S4 changing must be taken into account in the control unit 240 by inserting an appropriate delay between changing the control signal B[3:0] and subsequent monitoring of the signal S4. When the quantity of the current I is small, the control unit 240 may increase or decrease the code of the control signal B[3:0] by one LSB during an integration period. However, when the quantity of the current I is large, the control unit 240 may increase or decrease the code of the control signal B[3:0] by a larger increment. Therefore, in order to measure large-sized currents, the charge corresponding to each transition in the code of the control signal B[3:0] must be increased. For the control signal B[3:0], larger code steps may also be needed during the setup period when large currents are being measured.

If the capacitors C1, C2, C3 and C4 are not switched simultaneously, voltage spikes may be generated in the signal $V_{IN}$. The polarity of the voltage spikes depend on the timing of the switching of the individual bits of the control signal B[3:0] applied to the capacitors C1, C2, C3 and C4. The polarity of the spikes may determine whether the signal S4 is prematurely switched. For example, by delaying the rising edges of the signals applied to the capacitors C1, C2, C3 and C4 compared to the falling edges, the voltage spikes may have a negative polarity so as to avoid premature switching of the signal S4.

It is to be noted that, the operation of the current measurement circuit 200 described above is for measurement of a negative current. The operation of the current measurement circuit 200 depends on the polarity or sign of the current I. For example, the current measurement circuit 200 can be used to measure a positive current, but the control signal applied to the capacitors C1, C2, C3 and C4 and the signal S4 must have inverted logic. Furthermore, the changes in voltage applied to the capacitors C1, C2, C3 and C4 by the control unit 240 during a measurement state are arranged to compensate for charges associated with the current I which is integrated on the capacitance at the input node $N_{in}$, so that the voltage of the signal $V_{IN}$ is maintained at a voltage level that is close to the threshold voltage of the comparator 220.

According to the embodiments of the invention, the current measurement circuit is able to correct for variation in the threshold voltage of the comparator so as to minimize the duration of the initial integration period (i.e. setup period). Furthermore, by using a plurality of feedback capacitors with lower values, the magnitude of the voltage step-up at the input of the current measurement circuit may be reduced. Therefore, the situation where the input voltage is constant, is better approximated.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current measurement circuit for measuring a current, comprising:
a current integrating unit with a capacitor array, integrating the current on the capacitor array to obtain an input voltage;
a comparator coupled to the current integrating unit, comparing the input voltage with a specific voltage to generate a compare output; and
a control unit coupled to the comparator and the current integrating unit, generating a control signal to apply to the capacitor array of the current integrating unit according to the compare output,
wherein a magnitude of the current is obtained according to the control signal and the capacitance of the capacitor array,
wherein the capacitor array comprises a plurality of capacitors coupled between the comparator and the control unit, and capacitances of the capacitors are binary weighted,
wherein the comparator comprises:
a first inverter, receiving a reset signal;
a second inverter coupled to an output of the first inverter;
a third inverter coupled between the current integrating unit and the control unit;
a switch connected with the third inverter in parallel, having a control terminal coupled to the output of the first inverter, and correcting offset of the third inverter when the switch is turned on by the reset signal during a reset state; and
a transistor, having a gate coupled to an output of the second inverter, a drain coupled to an input of the third inverter and a source coupled to the input of the third inverter, wherein the specific voltage is a threshold voltage of the inverter.

2. The current measurement circuit as claimed in claim 1, wherein the control unit changes the control signal, so as to maintain the input voltage at a voltage level that is close to the specific voltage.

3. The current measurement circuit as claimed in claim 1, further comprising:
   a Schmitt inverter with a hysteresis, wherein the Schmitt inverter is coupled to and between the comparator and the control unit.

4. The current measurement circuit as claimed in claim 1, wherein each of the capacitors has a first terminal coupled to the comparator for receiving the current and a second terminal for receiving the control signal,
   wherein the control signal comprises a plurality of bit signals, each for applying to the second terminal of the corresponding capacitor, and
   wherein the input voltage is obtained according to the capacitances of the capacitors and the bit signals.

5. The current measurement circuit as claimed in claim 4, wherein the current integrating unit further comprises a plurality of buffers for buffering the bit signals before the bit signals are applied to the capacitors.

6. The current measurement circuit as claimed in claim 1, wherein an input voltage and an output voltage of the inverter are equal to the threshold voltage of the inverter during the reset state.

7. A measuring method for measuring a current, comprising:
   integrating the current on a capacitor array of a current integrating unit to obtain an input voltage;
   comparing the input voltage with a specific voltage to generate a compare output by a comparator;
   generating a control signal to apply to the capacitor array of the current integrating unit according to the compare output by a control unit; and
   obtaining a magnitude of the current according to the control signal and the capacitance of the capacitor array by the control unit,
   wherein the capacitor array comprises a plurality of capacitors coupled between the comparator and the control unit, and capacitances of the capacitors are binary weighted,
   wherein the comparator comprises:
      a first inverter, receiving a reset signal;
      a second inverter coupled to an output of the first inverter;
      a third inverter coupled between the current integrating unit and the control unit;
      a switch connected with the third inverter in parallel, having a control terminal coupled to the output of the first inverter, and correcting offset of the third inverter when the switch is turned on by the reset signal during a reset state; and
      a transistor, having a gate coupled to an output of the second inverter, a drain coupled to an input of the third inverter and a source coupled to the input of the third inverter,
      wherein the specific voltage is a threshold voltage of the inverter.

8. The measuring method as claimed in claim 7, wherein the control unit changes the control signal so as to maintain the input voltage at a voltage level that is close to the specific voltage.

9. The measuring method as claimed in claim 7, wherein each of the capacitors has a first terminal coupled to the comparator for receiving the current and a second terminal for receiving the control signal,
   wherein the control signal comprises a plurality of bit signals, each for applying to the second terminal of the corresponding capacitor, and
   wherein the input voltage is obtained according to the capacitances of the capacitors and the bit signals.

10. The measuring method as claimed in claim 9, wherein the current integrating unit further comprises a plurality of buffers for buffering the bit signals before the bit signals are applied to the capacitors.

11. The current measurement circuit as claimed in claim 7, wherein an input voltage and an output voltage of the inverter are equal to the threshold voltage of the inverter during the reset state.

* * * * *